United States Patent
Watanabe (10) Patent No.: US 10,630,023 B2
(45) Date of Patent: Apr. 21, 2020

(54) ELECTRONIC DEVICE AND SHUNT RESISTOR FIXING STRUCTURE

(71) Applicant: DENSO TEN Limited, Kobe-shi, Hyogo (JP)

(72) Inventor: Nobutaka Watanabe, Kobe (JP)

(73) Assignee: DENSO TEN Limited, Kobe (JP)

( * ) Notice: Subject to any disclaimer, the term of this patent is extended or adjusted under 35 U.S.C. 154(b) by 0 days.

(21) Appl. No.: 16/276,048

(22) Filed: Feb. 14, 2019

(65) Prior Publication Data
US 2019/0312383 A1 Oct. 10, 2019

(30) Foreign Application Priority Data

Apr. 9, 2018 (JP) ................... 2018-074851

(51) Int. Cl.
*H01R 13/627* (2006.01)
*H01R 31/08* (2006.01)
*H05K 5/00* (2006.01)

(52) U.S. Cl.
CPC ......... *H01R 13/6273* (2013.01); *H01R 31/08* (2013.01); *H05K 5/0069* (2013.01); *H05K 5/006* (2013.01); *H05K 5/0052* (2013.01)

(58) Field of Classification Search
CPC .. H01R 13/46; H01R 13/502; H01R 13/5025; H01R 13/5045; H01R 13/6271; H01R 13/6273; H01R 31/08; H01R 2201/26; H05K 5/0052; H05K 5/006; H05K 5/0069
See application file for complete search history.

(56) References Cited

U.S. PATENT DOCUMENTS

| | | | | |
|---|---|---|---|---|
| 3,926,497 A * | 12/1975 | Eigenbrode | ........ | H01R 13/6273 439/353 |
| 3,941,447 A * | 3/1976 | Hargrave | ............. | G03B 15/041 439/356 |
| 4,583,640 A * | 4/1986 | Gillam | ................. | H01R 13/514 206/716 |
| 4,607,899 A * | 8/1986 | Romine | ................. | H01R 31/08 29/845 |
| 6,030,248 A * | 2/2000 | Dancel | ............... | H01R 12/7005 439/345 |
| 6,551,147 B2 * | 4/2003 | Wakata | ................ | G01R 31/364 439/754 |
| 7,749,015 B2 * | 7/2010 | Uchikawa | .......... | H01R 13/6395 439/362 |

(Continued)

FOREIGN PATENT DOCUMENTS

JP 2015-123846 A 7/2015

*Primary Examiner* — Oscar C Jimenez
(74) *Attorney, Agent, or Firm* — Oliff PLC (57) ABSTRACT

An electronic device includes: a connector that is to be electrically connected to a shunt resistor; a circuit board electrically connected to the connector; and a case within which the circuit board is provided and which has, at an outer side of the case, a base on which the shunt resistor is to be mounted and a protruding part provided apart from the base, the protruding part has a first protrusion on a leading end of the protruding part, and the base and the protruding part are to hold the shunt resistor interposed therebetween, and the first protrusion is to engage with the shunt resistor, whereby the shunt resistor is to be fixed in a state where the shunt resistor is connected to the connector.

19 Claims, 9 Drawing Sheets

(56) References Cited

U.S. PATENT DOCUMENTS

| | | | | |
|---|---|---|---|---|
| 7,850,478 B2* | 12/2010 | Lin | ........................ | H01R 13/73 |
| | | | | 439/372 |
| 2004/0183520 A1* | 9/2004 | Guillon | .................. | G01R 15/18 |
| | | | | 324/117 H |
| 2006/0030176 A1* | 2/2006 | Ikeda | ...................... | H01M 2/34 |
| | | | | 439/76.2 |
| 2006/0216800 A1* | 9/2006 | Ishihara | ............... | G01R 15/207 |
| | | | | 435/135 |
| 2010/0285681 A1* | 11/2010 | Saruwatari | ......... | H01R 13/6395 |
| | | | | 439/345 |
| 2011/0097922 A1* | 4/2011 | Katayanagi | .......... | H01R 12/724 |
| | | | | 439/345 |
| 2012/0208387 A1* | 8/2012 | Takeda | ............... | H01R 12/7005 |
| | | | | 439/310 |
| 2013/0280941 A1* | 10/2013 | Muro | .................... | H01R 13/42 |
| | | | | 439/345 |
| 2016/0104973 A1* | 4/2016 | Shimizu | ............. | H01R 13/6581 |
| | | | | 439/607.01 |
| 2016/0299175 A1* | 10/2016 | Dewey | ............... | G01R 31/2834 |
| 2018/0090879 A1* | 3/2018 | Hasegawa | ............ | H01B 7/0045 |
| 2018/0316134 A1* | 11/2018 | Tanaka | ............... | H01R 13/6215 |

* cited by examiner

ELECTRONIC DEVICE AND SHUNT RESISTOR FIXING STRUCTURE

CROSS-REFERENCE TO RELATED APPLICATIONS

This application is based on and claims priority under 35 USC 119 from Japanese Patent Application No. 2018-074851 filed on Apr. 9, 2018.

FIELD OF THE INVENTION

The present invention relates to an electronic device and a shunt resistor fixing structure.

BACKGROUND OF THE INVENTION

To a load such as a power amplifier connected to an electronic device such as an electronic control unit (ECU) mounted on a vehicle, a voltage is applied by a regular power supply connected to the electronic device via a wire harness. The electronic device includes a circuit board having a shunt resistor, a current sense amplifier, a microcomputer, and the like, and a case within which the circuit board is provided.

The shunt resistor is arranged between the regular power supply and the load in order to monitor the value of current flowing in the load (for example, Japanese Patent Application Laid-Open No. 2015-123846). The current sense amplifier amplifies the voltage between both ends of the shunt resistor corresponding to the value of current flowing in the load, and outputs the amplified voltage to the microcomputer. The microcomputer uses the voltage amplified by the current sense amplifier, as a control parameter.

Recently, a demand that such electronic devices be downsized has been increasing. If a connector to be electrically connected to the shunt resistor is installed on the circuit board, instead of installing the shunt resistor on the circuit board, and the shunt resistor is fixed with screws, it is possible to downsize the electronic device.

SUMMARY OF THE INVENTION

However, in the case of fixing the shunt resistor with screws, since it is required to place the bearing surfaces of the screws on the shunt resistor, the size of the electronic device becomes large. Therefore, it becomes difficult to downsize the electronic device. Further, in the case of fixing the shunt resistor with screws, if backlash occurs, since the contact points between the shunt resistor and the connector are displaced, variation in the resistance value of the shunt resistor may occur.

An object of the present invention is to provide an electronic device and a shunt resistor fixing structure which can be easily downsized and in which variation in the resistance value of a shunt resistor does not occur.

An electronic device according to the invention comprises: a connector that is to be electrically connected to a shunt resistor; a circuit board electrically connected to the connector; and a case within which the circuit board is provided and which has, at an outer side of the case, a base on which the shunt resistor is to be mounted and a protruding part provided apart from the base, wherein the protruding part has a first protrusion on a leading end of the protruding part, and the base and the protruding part are to hold the shunt resistor interposed therebetween and the first protrusion is to engage with the shunt resistor, whereby the shunt resistor is to be fixed in a state where the shunt resistor is connected to the connector.

Preferably, the protruding part has a second protrusion configured to press the shunt resistor when the first protrusion engages with the shunt resistor.

Preferably, a height of a leading end of the first protrusion from the protruding part is higher than a height of a leading end of the second protrusion from the protruding part.

Preferably, the base and the protruding part are arranged so as not to overlap each other as seen from above the case.

Preferably, the case is integrally formed.

Preferably, the case is integrally formed from an elastically deformable material.

Preferably, the protruding part is formed from an elastically deformable material.

A shunt resistor fixing structure of the invention is a shunt resistor fixing structure provided on a case within which a circuit board is provided, the circuit board being electrically connected to a connector to be electrically connected to a shunt resistor, comprising, at an outer side of the case: a base on which the shunt resistor is to be mounted; a protruding part provided apart from the base; and a protrusion provided on a leading end of the protruding part, wherein the base and the protruding part are to hold the shunt resistor interposed therebetween and the protrusion is to engage with the shunt resistor, whereby the shunt resistor is to be fixed in a state where the shunt resistor is connected to the connector.

According to the present invention, it is possible to provide an electronic device and a shunt resistor fixing structure which can be easily downsized and in which variation in the resistance value of a shunt resistor does not occur.

DETAILED DESCRIPTION OF THE INVENTION

An embodiment of an electronic device and a shunt resistor fixing structure according to the present invention will be described with reference to the drawings. In the present embodiment, the electronic device according to the present invention is realized as an electronic device such as an ECU.

Figure 1:
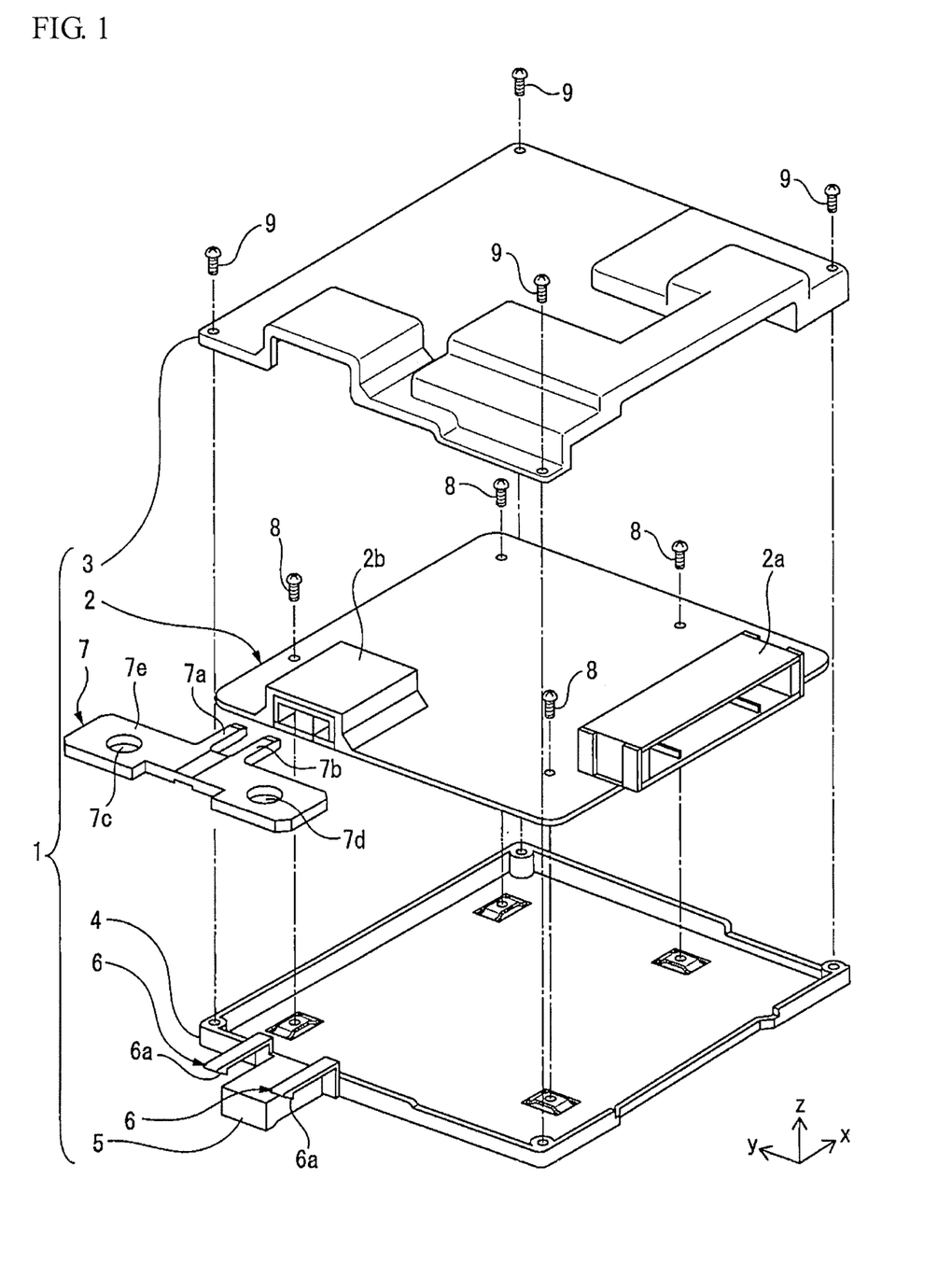
FIG. 1 is an exploded perspective view illustrating an electronic device 1 having a shunt resistor fixing structure according to the present invention.

FIG. 1 is an exploded perspective view illustrating an electronic device including a shunt resistor fixing structure according to the present invention. In FIG. 1, an electronic device 1 includes a circuit board 2, an upper cover 3, a lower cover 4, a base 5, two claws 6, and a shunt resistor 7. The lower cover 4 is an example of a case, and the claws 6 are an example of protruding part.

The circuit board 2 is rectangular, and is provided within the lower cover 4, and the edge of one surface of the circuit board 2 is fixed to the lower cover 4 with screws 8. In the present embodiment, the circuit board 2 has elements such as a current sense amplifier, a microcomputer, and the like (not shown in the drawings), a connector 2a which a counterpart connector provided at the leading end of a cable can be inserted into and be removed from, and a connector 2b which is electrically connected to the shunt resistor 7 when the shunt resistor 7 is inserted therein.

The connector 2a holds terminals for electric connection with the elements provided on the circuit board 2. The connector 2b electrically connects the shunt resistor 7 to the current sense amplifier when the shunt resistor 7 is inserted therein.

The upper cover 3 is formed with metallic materials such as aluminum die castings and an elastically deformable material such as a resin, and is fixed to the lower cover 4 with screws 9, so as to form a space for storing the circuit board 2 together with the lower cover 4.

Figure 2:
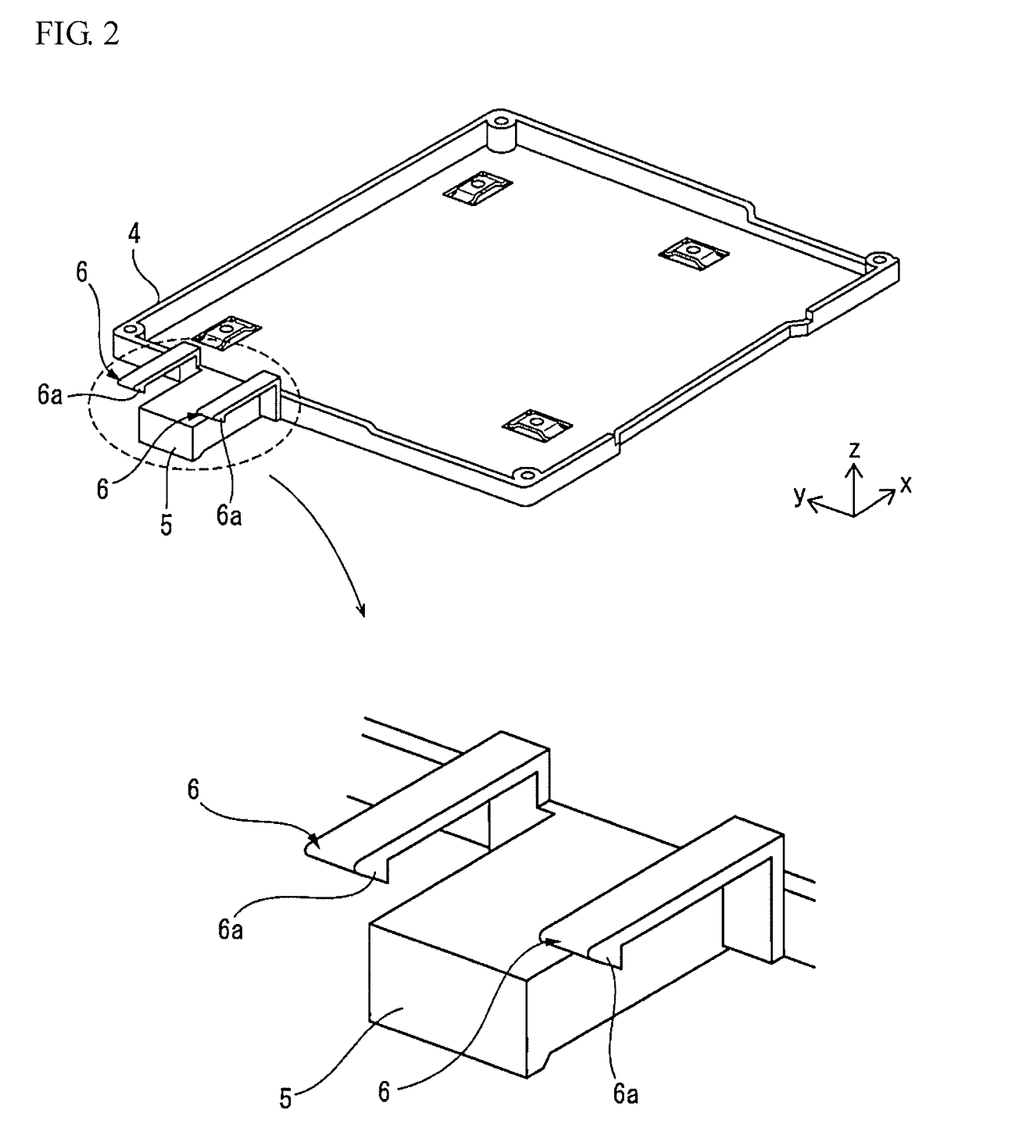
FIG. 2 is a perspective view illustrating a lower cover 4, a base 5, and claws 6 of FIG. 1.
Figure 3:
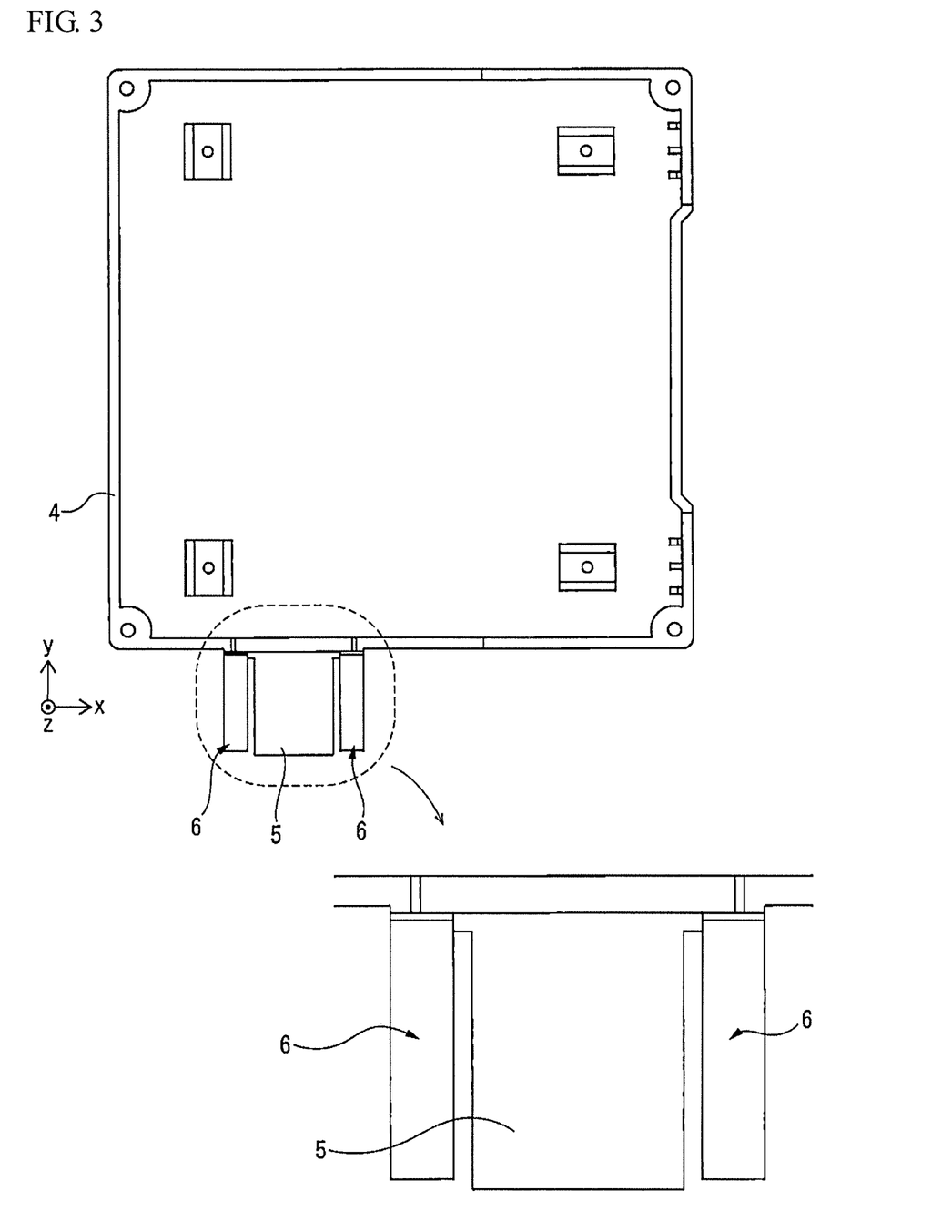
FIG. 3 is a top view illustrating the lower cover 4, the base 5, and the claws 6 of FIG. 1.

FIG. 2 is a perspective view illustrating the lower cover 4, the base 5, and the claws 6 of FIG. 1, and FIG. 3 is a top view illustrating the lower cover 4, the base 5, and the claws 6 of FIG. 1. As shown in FIG. 2 and FIG. 3, the lower cover 4 has the base 5 and the claws 6 at an outer side of the lower cover 4, and on the base 5, the shunt resistor 7 is to be mounted, and the claws 6 are provided apart from the base 5. The lower cover 4, the base 5, and the claws 6 are integrally formed from an elastically deformable material such as a resin. As shown in FIG. 3, the base 5 and the claws 6 are arranged so as not to overlap each other as seen from above the lower cover 4.

In the present embodiment, the claws 6 have substantially an L-shape. In each claw 6, one end is connected to the lower cover 4, and the other end has a protrusion 6a having a hook shape to engage with the shunt resistor 7 when the shunt resistor 7 is inserted in the connector 2b. In other words, each claw 6 has a first extension part which has one end connected to the lower cover 4 and extends in the height direction (a positive z direction), and a second extension part which has one end connected to the other end of the first extension part and the other end having the protrusion 6a and extends outward (in a negative x direction) from the side part of the lower cover 4. The other end is an example of a leading end. The claws 6 clamp the shunt resistor 7 together with the base 5 when the shunt resistor 7 is inserted in the connector 2b. In other words, the base 5 and the claws 6 hold the shunt resistor 7 interposed therebetween when the shunt resistor 7 is inserted in the connector 2b, and the protrusions 6a engage with the shunt resistor 7, whereby the shunt resistor 7 is fixed in a state where it is connected to the connector 2b. The protrusions 6a are an example of first protrusion.

The shunt resistor 7 has connection parts 7a and 7b, and an exposure part 7e having openings 7c and 7d. The connection part 7a is electrically connected to one input terminal of the current sense amplifier when the shunt resistor 7 is inserted in the connector 2b. The connection part 7b is electrically connected to the other input terminal of the current sense amplifier when the shunt resistor 7 is inserted in the connector 2b. To the opening 7c, a wire harness (not shown in the drawings) connected to the regular power supply (not shown in the drawings) is connected. To the opening 7d, a wire harness (not shown in the drawings) connected to a load (not shown in the drawings) is connected. The load is, for example, a power amplifier of an audio device, a navigation device, or the like. The exposure part 7e is exposed from the connector 2b when the shunt resistor 7 is inserted in the connector 2b.

The shunt resistor 7 is disposed between the regular power supply and the load when it is inserted in the connector 2b, and the current sense amplifier amplifies the voltage between both ends of the shunt resistor, corresponding to the value of current flowing in the load. Further, the microcomputer uses the voltage amplified by the current sense amplifier, as a parameter in order to monitor the value of current flowing in the load.

Figure 4:
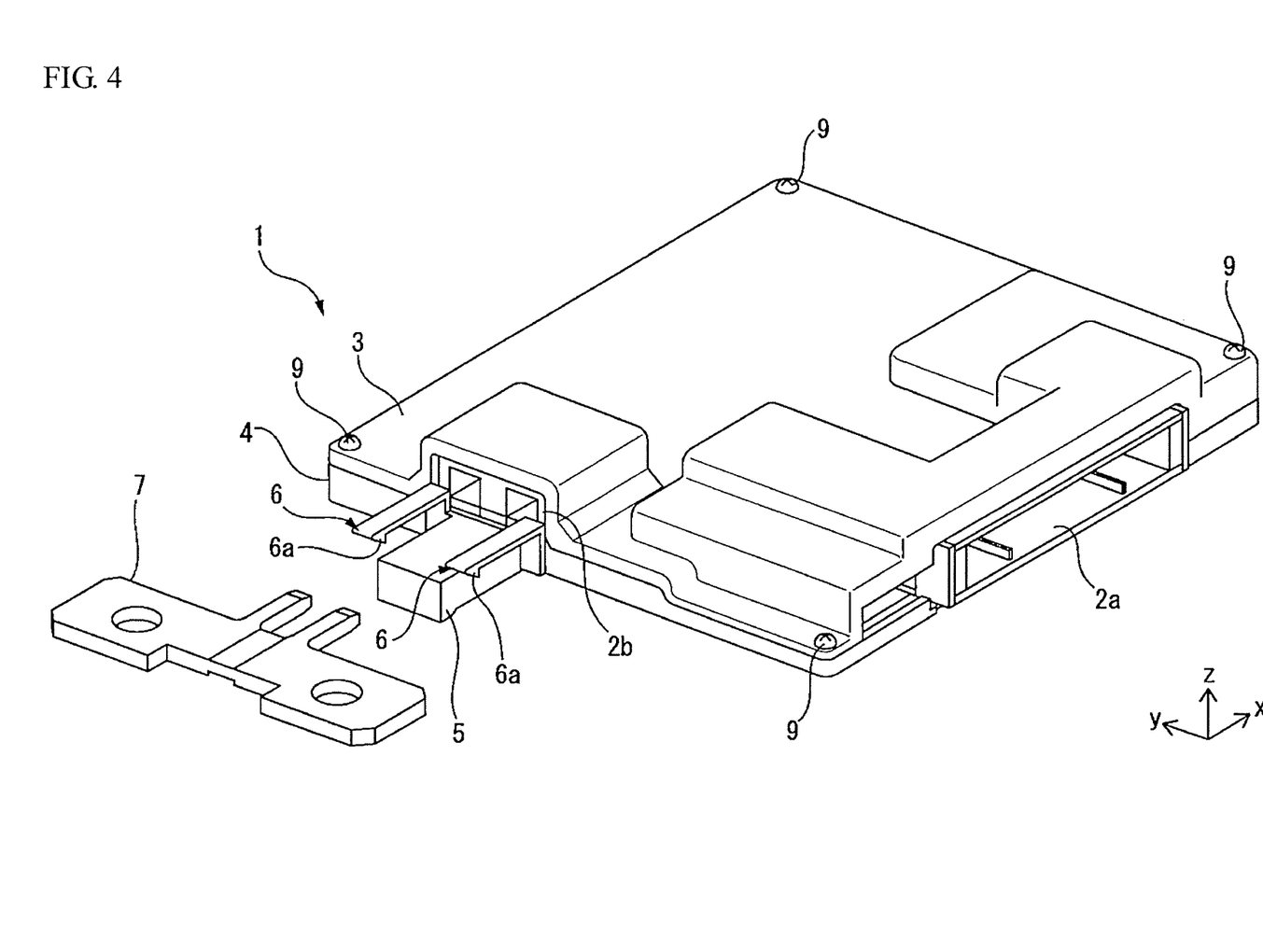
FIG. 4 is a perspective view illustrating the electronic device in a state where a shunt resistor 7 is separate from the shunt resistor fixing structure according to the present invention.
Figure 5:
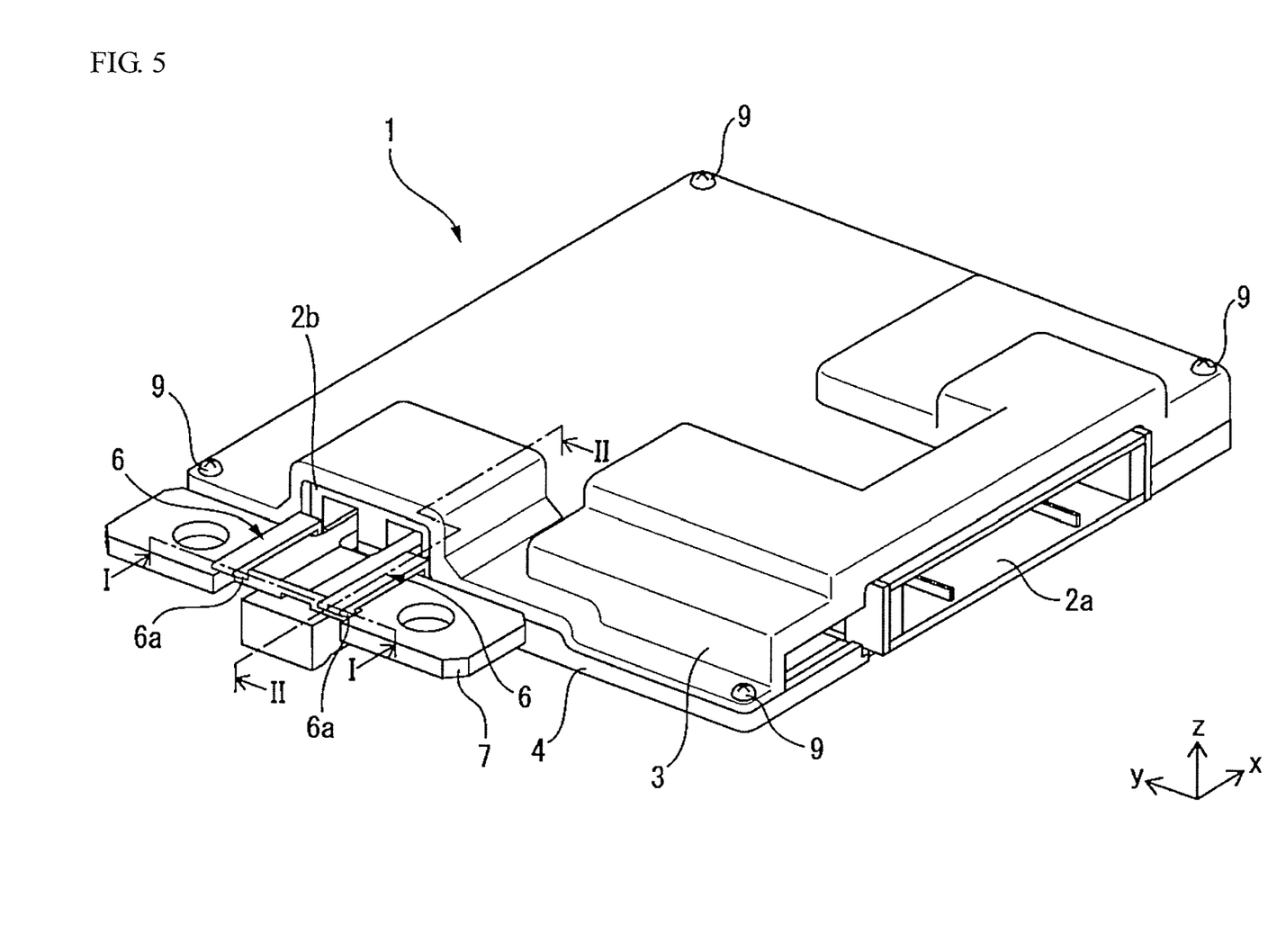
FIG. 5 is a perspective view illustrating the electronic device 1 in a state where the shunt resistor 7 is inserted in the shunt resistor fixing structure according to the present invention.
Figure 6:
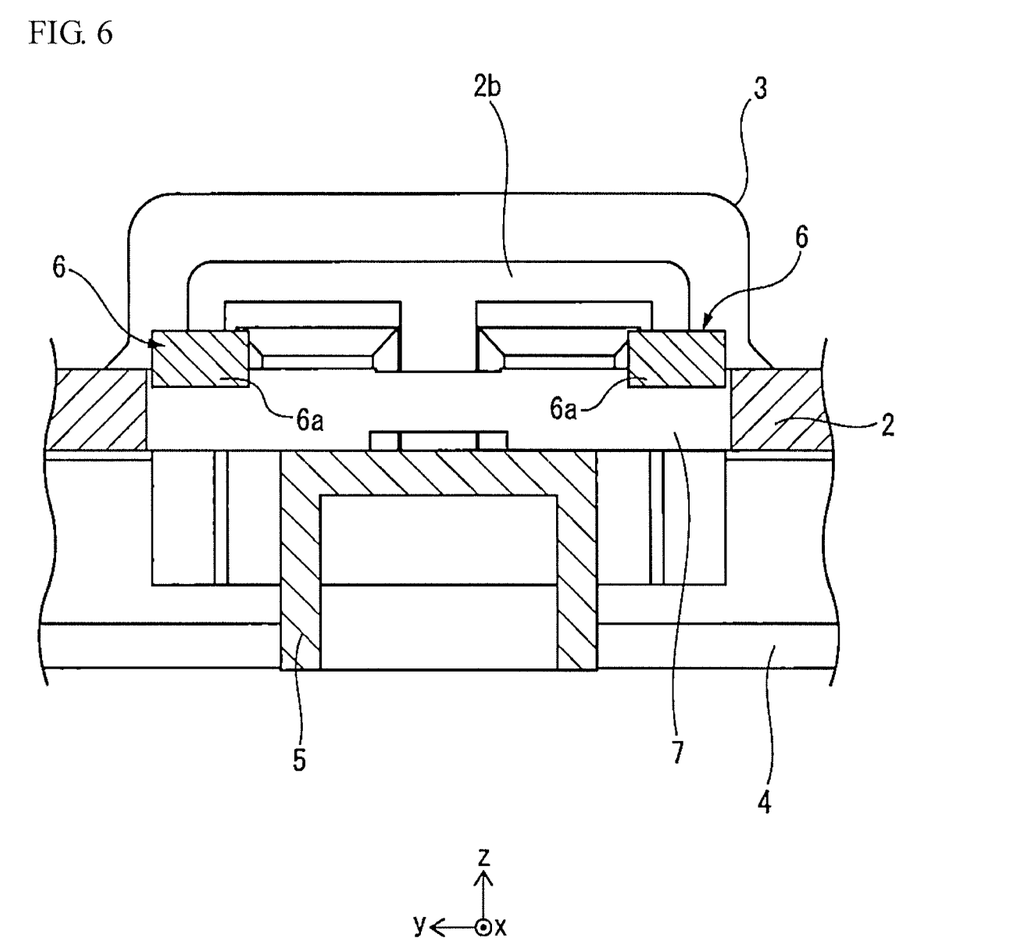
FIG. 6 is a cross-sectional view taken along a line I-I of FIG. 5.
Figure 7:
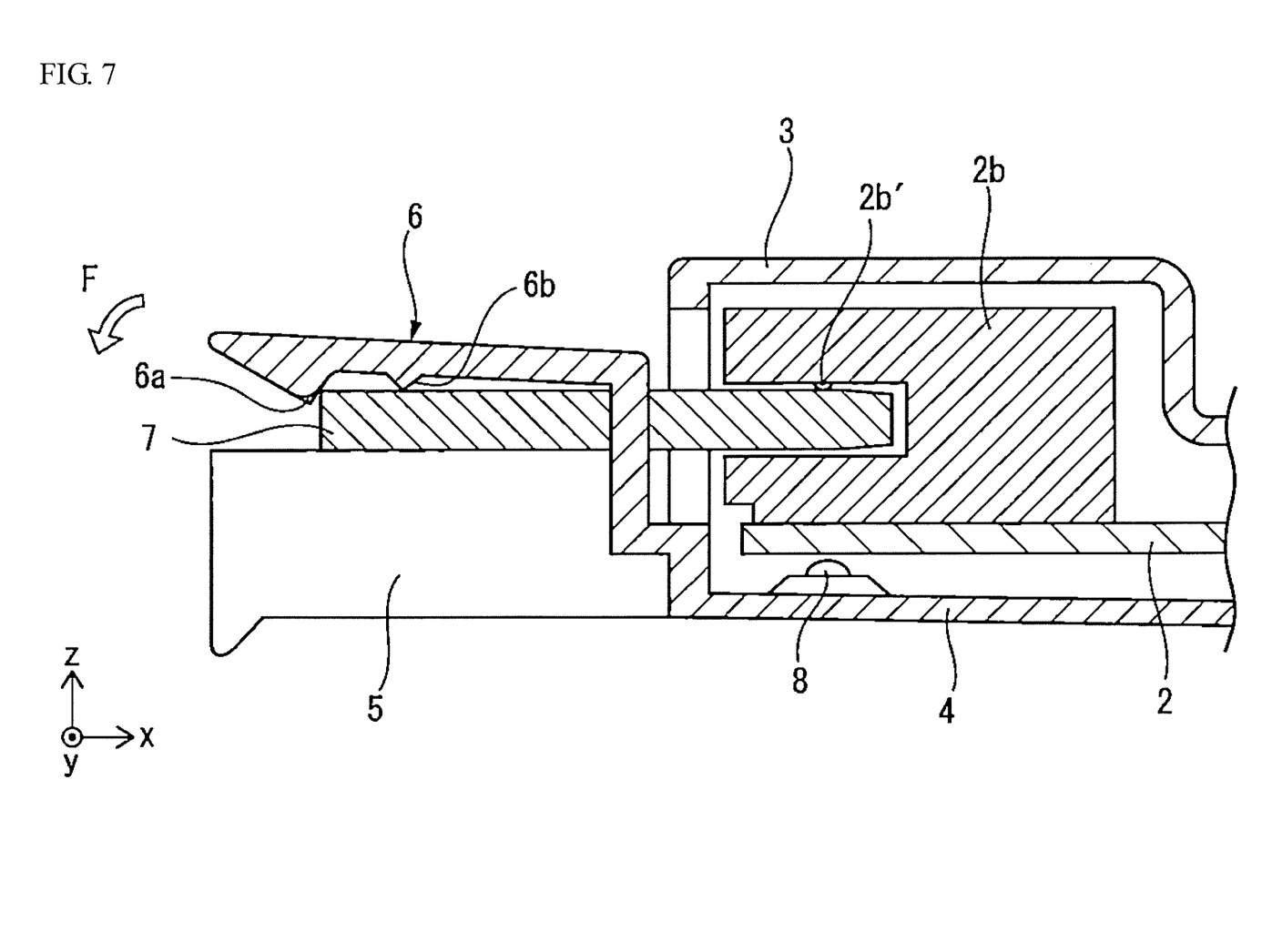
FIG. 7 is a cross-sectional view taken along a line II-II of FIG. 5.

FIG. 4 is a perspective view illustrating the electronic device in a state where the shunt resistor 7 is separate from the shunt resistor fixing structure according to the present invention, and FIG. 5 is a perspective view illustrating the electronic device 1 in a state where the shunt resistor 7 is inserted in the shunt resistor fixing structure according to the present invention, and FIG. 6 is a cross-sectional view taken along a line I-I of FIG. 5, and FIG. 7 is a cross-sectional view taken along a line II-II of FIG. 5.

As shown in FIG. 7, the claws 6 have protrusions 6b which have substantially a conical shape and press the shunt resistor 7 when the shunt resistor 7 is inserted in the connector 2b so that the protrusions 6a engage with the shunt resistor 7, and the connector 2b has contact points 2b' inside the connector 2b, the contact points 2b' being for being electrically connected to the current sense amplifier when the shunt resistor 7 is inserted. The protrusions 6b are an example of the second protrusion. Also, as shown in FIG. 7, if the shunt resistor 7 is inserted into the connector 2b while being guided along the base 5, the claws 6 clamp the shunt resistor 7 together with the base 5 with biasing forces F caused by reaction forces attributable to their elastic deformation when the shunt resistor 7 is inserted in the connector 2b, whereby the protrusions 6b come into contact with the shunt resistor 7 at points. Also, as shown in FIG. 7, the height of the leading ends of the protrusions 6a from the claws 6 (the second extension parts of the claws 6) is higher than the height of the leading ends of the protrusions 6b from the claws 6 (the second extension parts of the claws 6). Further, as shown in FIG. 7, in the case where the protrusions 6a have engaged with the shunt resistor 7, the height of the leading ends of the protrusions 6a from the surface of the base 5 having the shunt resistor 7 mounted thereon is lower than the height of the leading ends of the protrusions 6b from the surface of the base 5 having the shunt resistor 7 mounted thereon.

Figure 8:
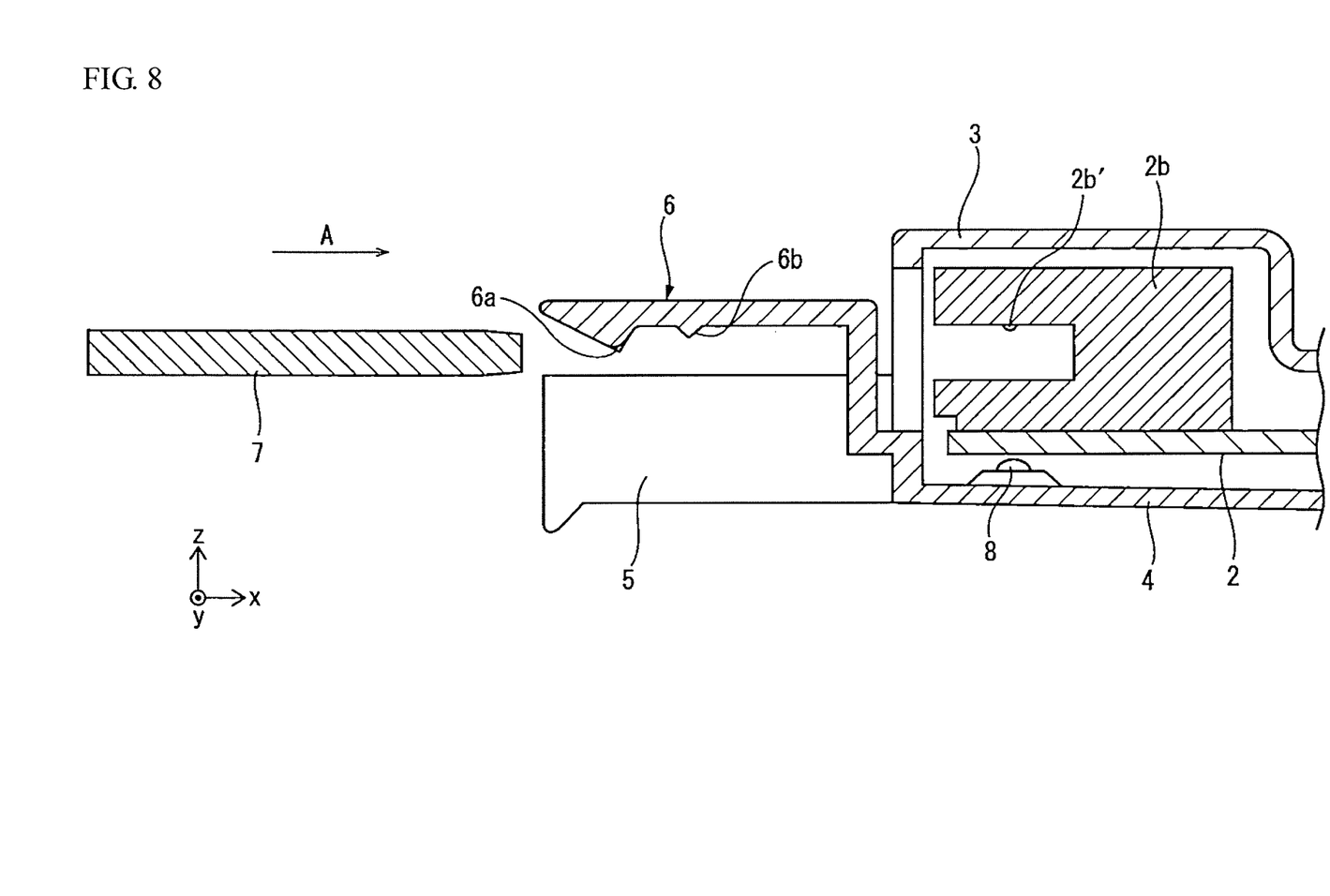
FIG. 8 is a view for explaining inserting of the shunt resistor 7 into the shunt resistor fixing structure according to the present invention.
Figure 9:
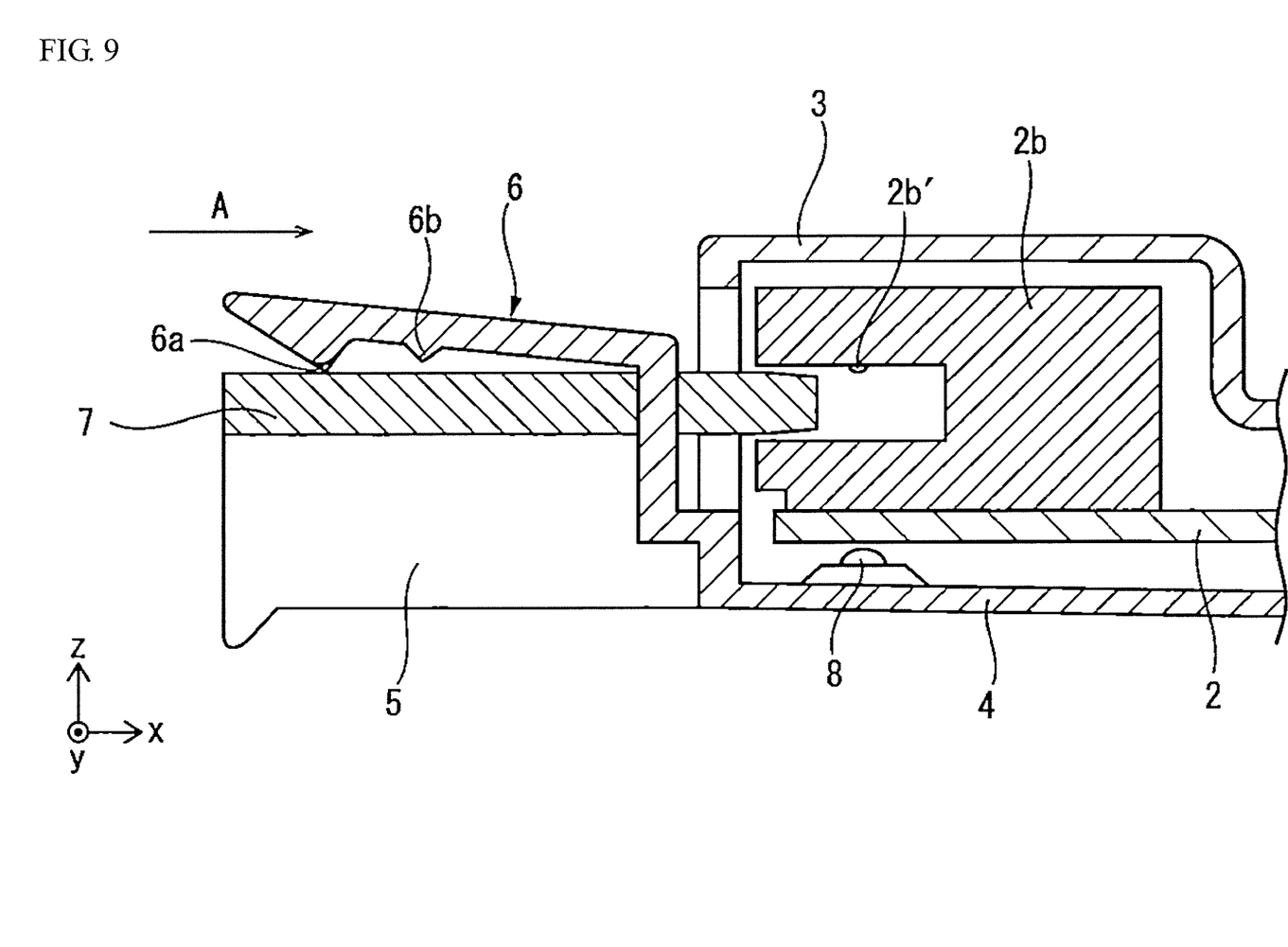
FIG. 9 is a view for explaining inserting of the shunt resistor 7 into the shunt resistor fixing structure according to the present invention.

FIG. 8 and FIG. 9 are views for explaining inserting of the shunt resistor 7 into the shunt resistor fixing structure according to the present invention. If the shunt resistor 7 is guided along the base 5 (along a direction shown by an arrow "A") as shown in FIG. 8, the second extension parts of the claws 6 are elastically deformed in the height direction (the z direction) as shown in FIG. 9, and thereafter, the shunt resistor 7 is inserted into the connector 2b as shown in FIG.

7. At this time, the first extension parts of the claws 6 serve as stoppers when the shunt resistor 7 is inserted into the connector 2b.

According to the present embodiment, if the shunt resistor 7 is inserted into the connector 2b, the base 5 and the claws 6 hold the shunt resistor 7 interposed therebetween, and the protrusions 6a engage with the shunt resistor 7, whereby the shunt resistor 7 is fixed in the state where it is connected to the connector 2b. In other words, the shunt resistor fixing structure provided on the lower cover 4 containing the circuit board 2 electrically connected to the connector 2b to be electrically connected to the shunt resistor 7 is configured, and that shunt resistor fixing structure has the lower cover 4, the base 5, and the claws 6, and the base 5 and the claws 6 hold the shunt resistor 7 interposed therebetween, and the protrusions 6a engage with the shunt resistor 7, whereby the shunt resistor 7 is fixed in the state where it is connected to the connector 2b. Therefore, since the shunt resistor 7 is not fixed with screws, it becomes unnecessary to place the bearing surfaces of screws on the shunt resistor 7, and it becomes easy to downsize the electronic device 1. Further, since the shunt resistor 7 is not fixed with screws, variation which may occur in the case where the shunt resistor 7 is fixed with screws does not occur. Therefore, variation in the resistance value of the shunt resistor 7 which may occur due to misalignment between the shunt resistor 7 and the contact points 2b' does not occur. Also, as compared to the case of using screws to fix the shunt resistor 7, it is possible to reduce the cost of the electronic device 1 and it is possible to make the electronic device 1 lighter. Also, since it becomes unnecessary to place the bearing surfaces of screws on the shunt resistor 7, as compared to the case of using screws to fix the shunt resistor 7, it is possible to downsize the shunt resistor 7 and it is possible to make the shunt resistor light.

Since the protrusions 6a and the protrusions 6b are formed, it is possible to more firmly fix the shunt resistor 7. Also, since the height of the leading ends of the protrusions 6a from the claws 6 (the second extension parts of the claws 6) is higher than the height of the leading ends of the protrusions 6b from the claws 6 (the second extension parts of the claws 6), it is possible to more effectively prevent the shunt resistor 7 from slipping out of the connector 2b.

Since the base 5 and the claws 6 are arranged so as not to overlap each other as seen from above the lower cover 4, backlash is prevented from occurring when the shunt resistor 7 is inserted in the connector 2b. Further, since the base 5 and the claws 6 are arranged so as not to overlap each other as seen from above the lower cover 4, it is possible to omit slide structures from the molds for forming the lower cover 4, the base 5, and the claws 6.

Also, since the lower cover 4, the base 5, and the claws 6 are integrally formed, the number of components of the electronic device 1 decreases. Therefore, it is possible to reduce the cost and man-hours of assembly. Also, since the lower cover 4, the base 5, and the claws 6 are formed from an elastically deformable material, if the shunt resistor 7 is inserted into the connector 2b, the claws 6 can clamp the shunt resistor 7 together with the base 5 with the biasing forces F caused by the reaction forces attributable to their elastic deformation.

The present invention is not limited to the above-described embodiment, and a variety of changes and modifications can be made. For example, the shunt resistor 7 may be omitted from the electronic device 1. Also, the number of claws 6 may be one, or may be three or more. Also, the protrusions 6b may be configured in such an arbitrary shape that the protrusions can come into contact with the shunt resistor 7 at points, like a pyramid such as a triangular pyramid or a square pyramid.

Also, it is possible to form at least one of the lower cover 4 and the base 5 of a material which is not elastically deformable and form the claws 6 of an elastically deformable material. Even in this case, if the shunt resistor 7 is inserted into the connector 2b, the claws 6 can clamp the shunt resistor 7 together with the base 5 with the biasing forces F caused by the reaction forces attributable to their elastic deformation.

What is claimed is:

1. An electronic device comprising:
    a connector that is configured to be electrically connected to a shunt resistor;
    a circuit board electrically connected to the connector; and
    a case within which the circuit board is provided, an outer side of the case having:
        a base on which the shunt resistor is to be mounted; and
        a protruding part provided apart from the base, a leading end of the protruding part having a first protrusion,
    wherein the base and the protruding part are configured to hold the shunt resistor interposed therebetween with the shunt resistor in direct contact with the base, and the first protrusion is configured to engage with the shunt resistor, whereby the shunt resistor is to be fixed in a state where the shunt resistor is connected to the connector.

2. The electronic device according to claim 1, wherein the protruding part has a second protrusion configured to press the shunt resistor when the first protrusion engages with the shunt resistor.

3. The electronic device according to claim 2, wherein a height of a leading end of the first protrusion from the protruding part is higher than a height of a leading end of the second protrusion from the protruding part.

4. The electronic device according to claim 3, wherein the base and the protruding part are arranged so as not to overlap each other as seen from above the case.

5. The electronic device according to claim 3, wherein the case is integrally formed.

6. The electronic device according to claim 5, wherein the case is integrally formed from an elastically deformable material.

7. The electronic device according to claim 3, wherein the protruding part is formed from an elastically deformable material.

8. The electronic device according to claim 2, wherein the base and the protruding part are arranged so as not to overlap each other as seen from above the case.

9. The electronic device according to claim 2, wherein the case is integrally formed.

10. The electronic device according to claim 9, wherein the case is integrally formed from an elastically deformable material.

11. The electronic device according to claim 2, wherein the protruding part is formed from an elastically deformable material.

12. The electronic device according to claim 1, wherein the base and the protruding part are arranged so as not to overlap each other as seen from above the case.

13. The electronic device according to claim 12, wherein the case is integrally formed.

14. The electronic device according to claim 13, wherein the case is integrally formed from an elastically deformable material.

15. The electronic device according to claim 12, wherein the protruding part is formed from an elastically deformable material.

16. The electronic device according to claim 1, wherein the case is integrally formed.

17. The electronic device according to claim 16, wherein the case is integrally formed from an elastically deformable material.

18. The electronic device according to claim 1, wherein the protruding part is formed from an elastically deformable material.

19. A shunt resistor fixing structure provided on a case within which a circuit board is provided, the circuit board being electrically connected to a connector to be electrically connected to a shunt resistor, comprising, at an outer side of the case:
- a base on which the shunt resistor is configured to be mounted;
- a protruding part provided apart from the base; and
- a protrusion provided on a leading end of the protruding part,
- wherein the base and the protruding part are configured to hold the shunt resistor interposed therebetween with the shunt resistor in direct contact with the base, and the protrusion is configured to engage with the shunt resistor, whereby the shunt resistor is to be fixed in a state where the shunt resistor is connected to the connector.

* * * * *